(12) United States Patent
Kim et al.

(10) Patent No.: US 10,692,846 B2
(45) Date of Patent: Jun. 23, 2020

(54) PACKAGE-ON-PACKAGE (POP) SEMICONDUCTOR PACKAGE AND ELECTRONIC SYSTEM INCLUDING THE SAME

(71) Applicant: SAMSUNG ELECTRONICS CO., LTD., Suwon-si, Gyeonggi-do (KR)

(72) Inventors: Tong-suk Kim, Hwaseong-si (KR); Byeong-yeon Cho, Suwon-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 16/179,168

(22) Filed: Nov. 2, 2018

(65) Prior Publication Data

US 2019/0139946 A1 May 9, 2019

(30) Foreign Application Priority Data

Nov. 3, 2017 (KR) .................. 10-2017-0146171

(51) Int. Cl.
*H01L 23/00* (2006.01)
*H01L 25/10* (2006.01)
(Continued)

(52) U.S. Cl.
CPC ............ *H01L 25/105* (2013.01); *G11C 5/025* (2013.01); *G11C 5/04* (2013.01); *H01L 24/19* (2013.01); *H01L 24/20* (2013.01); *H01L 25/50* (2013.01); *H01L 24/13* (2013.01); *H01L 24/48* (2013.01); *H01L 2224/04105* (2013.01); *H01L 2224/12105* (2013.01); *H01L 2224/13111* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/1023* (2013.01); *H01L 2225/1035* (2013.01); *H01L 2225/1041* (2013.01); *H01L 2225/1058* (2013.01); *H01L 2924/00014* (2013.01); *H01L 2924/14* (2013.01); *H01L 2924/1434* (2013.01); *H01L 2924/15311* (2013.01); *H01L 2924/15331* (2013.01); *H01L 2924/181* (2013.01)

(58) Field of Classification Search
CPC .................. H01L 25/105; H01L 25/50; H01L 2225/1035; H01L 2225/1041; H01L 2225/1058
USPC ....................................................... 257/686
See application file for complete search history.

(56) References Cited

U.S. PATENT DOCUMENTS 8,193,604 B2    6/2012  Lin et al.
2001/0053068 A1  12/2001  Murayama et al.
(Continued)

FOREIGN PATENT DOCUMENTS

JP    2008-027996 A    2/2008
JP    2009-206205 A    9/2009

*Primary Examiner* — Tu-Tu V Ho
(74) *Attorney, Agent, or Firm* — Lee IP Law, P.C.

(57) ABSTRACT

A package-on-package (PoP) semiconductor package includes an upper package and a lower package. The lower package includes a first semiconductor device in a first area, a second semiconductor device in a second area, and a command-and-address vertical interconnection, a data input-output vertical interconnection, and a memory management vertical interconnection adjacent to the first area.

19 Claims, 8 Drawing Sheets

(51) Int. Cl.
*H01L 25/00* (2006.01)
*G11C 5/02* (2006.01)
*G11C 5/04* (2006.01)

(56) References Cited

U.S. PATENT DOCUMENTS

| | | | |
|---|---|---|---|
| 2014/0319662 A1* | 10/2014 | You | H01L 23/481 257/665 |
| 2015/0115467 A1* | 4/2015 | Park | H01L 23/3128 257/774 |
| 2015/0245487 A1 | 8/2015 | Kim et al. | |
| 2016/0381800 A1 | 12/2016 | Yagnamurthy et al. | |
| 2017/0040298 A1 | 2/2017 | Chen et al. | |

\* cited by examiner

PACKAGE-ON-PACKAGE (POP) SEMICONDUCTOR PACKAGE AND ELECTRONIC SYSTEM INCLUDING THE SAME

CROSS-REFERENCE TO RELATED APPLICATION

Korean Patent Application No. 10-2017-0146171, filed on Nov. 3, 2017, and entitled, "Package-On-Package (Pop) Semiconductor Package and Electronic System Including the Same," is incorporated by reference herein in its entirety.

BACKGROUND

1. Field

One or more embodiments described here in relates to a package-on-package (PoP) semiconductor package and an electronic system including a PoP semiconductor.

2. Description of the Related Art

The demand for thin electronic devices continues to increase. In order to meet this demand, attempts are being made to reduce the thicknesses of semiconductor packages and improve their electrical properties. However, reducing the thicknesses of semiconductor packages may make then vulnerable to warpage and other forms of mechanical deformation.

SUMMARY

In accordance with one or more embodiments, a package-on-package (PoP) semiconductor package includes an upper package and a lower package including a first semiconductor device in a first area, a second semiconductor device in a second area, and a command-and-address vertical interconnection, a data input-output vertical interconnection, and a memory management vertical interconnection adjacent to the first area.

In accordance with one or more other embodiments, a stack semiconductor package includes an upper package; and a lower package including: an application processor (AP) chip; a power management integrated circuit chip; and a command-and-address (CA) vertical interconnection and a data input-output vertical interconnection adjacent to the AP chip in side directions of the AP chip, wherein the AP chip and the power management integrated circuit chip are arranged in a lateral direction.

In accordance with one or more other embodiments, a package-on-package (PoP) semiconductor package includes an upper package and a lower package including an application processor chip in a first area, a power management integrated circuit chip in a second area, and at least one of a command-and-address vertical interconnection and a memory management vertical interconnection between the AP chip and the power management integrated circuit chip.

In accordance with one or more other embodiments, an electronic system including a controller, an input-output to input or output data, a memory to store data, an interface to transfer data between the electronic system and a device external to the electronic system, and a bus to connect the controller, the input-output, the memory, and the interface to each other to allow communication therebetween, wherein at least one of the controller and the memory includes a package-on-package (PoP) semiconductor package in accordance with any of the embodiments described herein.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
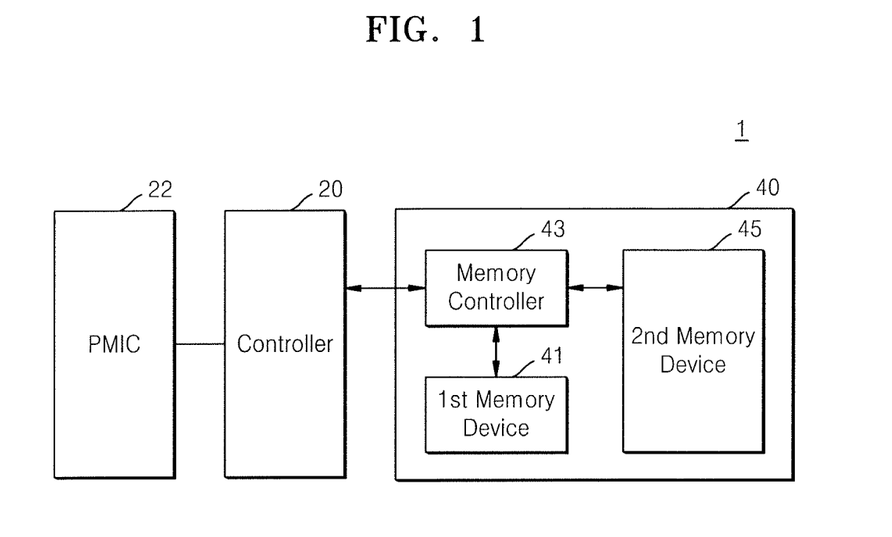
FIG. 1 illustrates an embodiment of PoP semiconductor package.

FIG. 1 illustrates an embodiment of a package-on-package (PoP) semiconductor package 1 which may include a controller 20 and a memory element 40. The memory element 40 may include a first memory device 41, a second memory device 45, and a memory controller 43. The PoP semiconductor package 1 may further include a power management integrated circuit (PMIC) 22 for supplying current for operation voltages to the controller 20, the first memory device 41, the second memory device 45, and the memory controller 43. The operation voltages may be the same or different from each other.

The PoP semiconductor package 1 may be included, for example, in a personal computer (PC) or a mobile device. Examples of the mobile device include a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet-of-things (IoT) device, an internet-of-everything (IoE) device, a drone, or another type of device mobile or stationary.

The controller 20 may control operation of the first memory device 41, the second memory device 45, and the memory controller 43. For example, the controller 20 may include an integrated circuit (IC), a system on chip (SoC), an application processor (AP), a mobile AP, a chipset, or a set of chips. For example, the controller 20 may include a central processing unit (CPU), a graphics processing unit (GPU), and/or a modem. In some embodiments, the controller 20 may perform a function of a modem and a function of an AP.

The memory controller 43 may control the second memory device 45 according to the control of the controller 20. Each of the first memory device 41, the second memory device 45, and the memory controller 43 may include a semiconductor chip or die. The first memory device 41 may include a volatile memory device. The volatile memory device may include random access memory (RAM), dynamic RAM (DRAM), static RAM (SRAM), or another type of memory.

The first memory device 41 may include Wide I/O DRAM, PDDR2 DRAM, LPDDR4 DRAM, LPDDR5 DRAM, or another type of memory. The first memory device 41 may be used, for example, as a buffer or buffer DRAM.

The second memory device 45 may include a storage memory device, which may include a non-volatile memory device having non-volatile memory cells. Examples of the non-volatile memory include electrically erasable programmable read-only memory (EEPROM), flash memory, magnetic RAM (MRAM), spin-transfer Torque MRAM, ferroelectric RAM (FeRAM), phase change RAM (PRAM), resistive RAM (RRAM), nanotube RRAM, polymer RAM (PoRAM), nano floating gate memory (NFGM), holographic memory, a molecular electronics memory device, or insulator resistance change memory.

The storage memory device may include a flash-based memory device or another type of memory. The second memory device 45 may include, for example, a NAND-type memory device. The NAND-type memory device may include a 2-dimensional memory cell array or a 3-dimensional memory cell array. The 2-dimensional memory cell array or the 3-dimensional memory cell array may include a plurality of memory cells. Each of the plurality of memory cells may store 1-bit information or 2 or more-bit information.

When the second memory device 45 includes a flash-based memory device, the memory controller 43 may use (or support) a multimedia card (MMC) interface, an embedded MMC (eMMC) interface, or a universal flash storage (UFS) interface, or another type of interface.

Figure 2A:
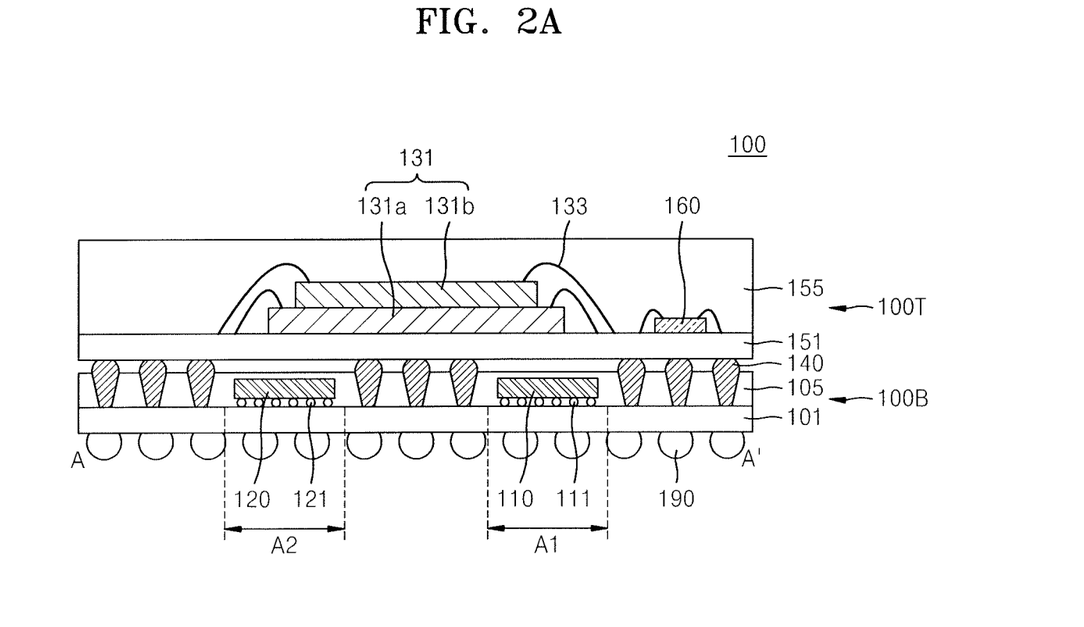
FIG. 2A illustrates a side cross-sectional view of a PoP semiconductor package according to an embodiment.
Figure 2B:
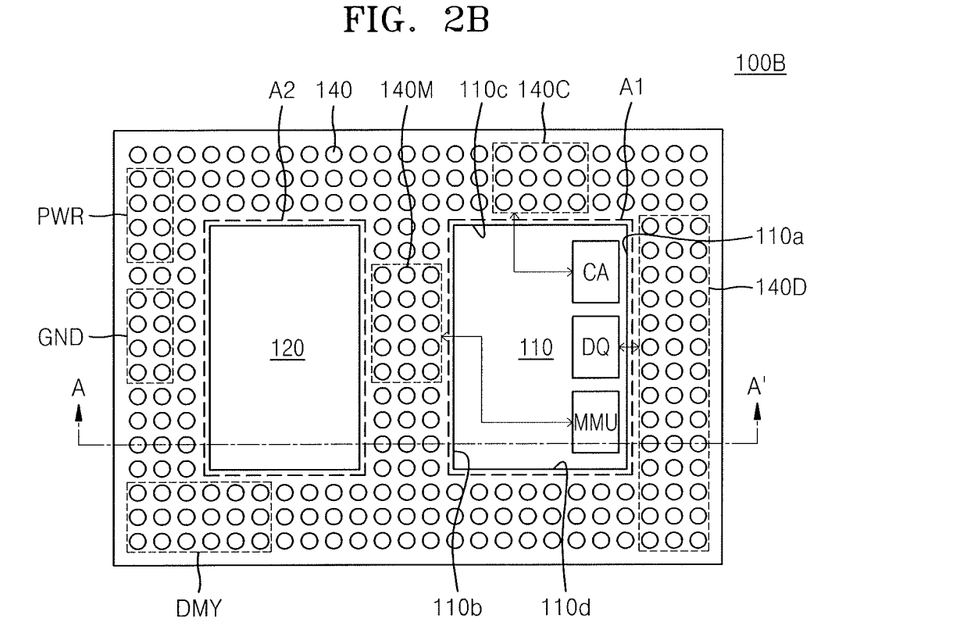
FIG. 2B illustrates a plan view of a lower package of the PoP semiconductor package of FIG. 2A.

FIG. 2A illustrates a side cross-sectional view of a PoP semiconductor package 100 according to an embodiment. FIG. 2B illustrates a plan view of a lower package 100B of the PoP semiconductor package 100 of FIG. 2A, as viewed from above. The sectional view of FIG. 2A may be taken along line A-A' of FIG. 2B.

Referring to FIGS. 2A and 2B, the lower package 100B may include a first semiconductor device 110 and a second semiconductor device 120 mounted on a lower package substrate 101. The first semiconductor device 110 may be in a first area A1 of the lower package 100B. The second semiconductor device 120 may be in a second area A2 of the lower package 100B.

The first semiconductor device 110 may be, for example, the controller 20 as described with reference to FIG. 1, e.g., an application processor (AP). The second semiconductor device 120 may be, for example, the power management integrated circuit 22.

The first semiconductor device 110 may be mounted on the lower package substrate 101 via a first conductive bump 111. The second semiconductor device 120 may be mounted on the lower package substrate 101 via a second conductive bump 121. The first conductive bump 111 may be substantially identical to the second conductive bump 121. Each of the first conductive bump 111 and the second conductive bump 121 may include, for example, a lead-free tin-based solder ball.

The first semiconductor device 110 and the second semiconductor device 120 may be encapsulated by an encapsulation material 105. The encapsulation material 105 may be, for example, an epoxy molding compound (EMC).

The first semiconductor device 110 and the second semiconductor device 120 may be arranged in a lateral direction. A plurality of vertical interconnections 140 may be arranged therearound. The plurality of vertical interconnections 140 may extend through the encapsulation material 105.

A vertical interconnection 140 may refer to an arbitrary conductor for electrically connecting the lower package 100B to an upper package 100T, with the lower package 100B and the upper package 100T being vertically stacked. In some embodiments, the vertical interconnection 140 may be a solder bump. In some embodiments, the vertical interconnection 140 may be a conductive plug.

The upper package 100T may include a memory device 131 mounted on an upper package substrate 151. The memory device 131 may include a first memory chip 131$a$ and a second memory chip 131$b$, which are vertically stacked. The memory device 131 may be electrically connected to the upper package substrate 151, for example, via a bonding wire 133.

FIG. 2A illustrates an example in which two memory chips are stacked. In another embodiment, three or more memory chips may be stacked. A plurality of memory chips may be electrically connected to each other by a through-silicon via (TSV). In addition, each of the plurality of memory chips may include the first memory device 41, the second memory device 45, or both, as described with reference to FIG. 1.

The upper package 100T may further include a memory controller 160 for directly controlling the memory device 131 according to the control of the first semiconductor device 110. The memory device 131 may be encapsulated by an encapsulation material 155, e.g., an epoxy molding compound. The first semiconductor device 110 may include a data input-output physical layer DQ, which is a physical layer transferring data. In addition, the first semiconductor device 110 may include a command-and-address (CA) input-output physical layer CA, which is a physical layer transferring commands and addresses.

The data input-output physical layer DQ may include an interface (for example, pads or pins) for transmitting and receiving data. The CA input-output physical layer CA may include an interface (for example, pads or pins) for transmitting and receiving commands and addresses. The data input-output physical layer DQ and the CA input-output physical layer CA may refer to channels.

The first semiconductor device 110 may further include a memory management physical layer MMU, which is a physical layer transferring signals for managing memory, and, for example, for managing the memory device 131 of the upper package 100T. In one embodiment, the memory management physical layer MMU may be a component for processing access to the memory device 131 for a central processing unit. For example, the memory management physical layer MMU may translate virtual addresses to physical addresses based on requests from a central processing unit, a graphics processing unit, a display controller, and/or a graphics engine. In addition, the memory management physical layer MMU may perform functions such as cache control, bus arbitration, bank switching, and/or other functions.

The memory management physical layer MMU may include an interface (for example, pads or pins) for transmitting and receiving signals for managing memory.

The data input-output physical layer DQ may be connected to a data input-output vertical interconnection 140D via the first conductive bump 111 and the lower package substrate 101. In addition, the data input-output physical layer DQ may transmit data to and receive data from the memory device 131 via the data input-output vertical interconnection 140D.

The CA input-output physical layer CA may be connected to a CA vertical interconnection 140C via the first conductive bump 111 and the lower package substrate 101. In addition, the CA input-output physical layer CA may transmit CA signals to and receive CA signals from the memory device 131 via the CA vertical interconnection 140C.

The memory management physical layer MMU may be connected to a memory management vertical interconnection 140M via the first conductive bump 111 and the lower package substrate 101. In addition, the memory management physical layer MMU may transmit memory management signals to and receive memory management signals from the memory device 131 via the memory management vertical interconnection 140M.

The data input-output vertical interconnection 140D may be adjacent to the first semiconductor device 110. For example, at least half of a plurality of data input-output vertical interconnections 140D may constitute some of vertical interconnections arranged in one or more rows along a side surface of the first semiconductor device 110.

In some embodiments, the CA vertical interconnection 140C may be adjacent to the first semiconductor device 110. In some embodiments, the memory management vertical interconnection 140M may be adjacent to the first semiconductor device 110.

When the data input-output vertical interconnection 140D, the CA vertical interconnection 140C, and the memory management vertical interconnection 140M are adjacent to the first semiconductor device 110, improved electrical properties of the PoP semiconductor package 100 may be obtained because deviation between connection paths of the respective vertical interconnections to the upper package 100T based on functions of the respective vertical interconnections may be reduced.

When the CA vertical interconnection 1400 or the memory management vertical interconnection 140M is arranged in opposition to the first semiconductor device 110 with respect to the second semiconductor device 120, rather than adjacent to the first semiconductor device 110, electrical performance and properties of a PoP semiconductor package may be insufficient since the path through which signals travel becomes too long.

In accordance with one or more embodiments, at least one of the data input-output vertical interconnection 140D, the CA vertical interconnection 140C, and the memory management vertical interconnection 140M may be between the first semiconductor device 110 and the second semiconductor device 120. FIG. 2B illustrates that the memory management vertical interconnection 140M is between the first semiconductor device 110 and the second semiconductor device 120. The memory management vertical interconnection 140M may be at a different location in another embodiment.

The first semiconductor device 110 may have a first side surface 110a that is parallel to a second side surface 110b. The first semiconductor device 110 may have a third side surface 110c that is parallel to a fourth side surface 110d.

The first side surface 110a (or second side surface 110b) may be substantially perpendicular to the third side surface 110c (or fourth side surface 110d). In addition, the second side surface 110b may face the second semiconductor device 120.

The data input-output vertical interconnection 140D may be adjacent to the first side surface 110a of the first semiconductor device 110. In this way, since a data transfer path to the memory device 131 in the upper package 100T may be reduced as much as possible, high-speed efficient transfer of data may be achieved.

In addition, the CA vertical interconnection 140C may be adjacent to the third side surface 110c of the first semiconductor device 110. In this way, since a path for transferring CA signals between the CA vertical interconnection 140C and the first semiconductor device 110 may be reduced as much as possible, high-speed efficient transfer of CA signals may be achieved.

FIG. 2B illustrates that the CA vertical interconnection 140C is adjacent to the third side surface 110c. The CA vertical interconnection 140C may be adjacent to the fourth side surface 110d in another embodiment.

The memory management vertical interconnection 140M may be adjacent to the second side surface 110b. For example, the memory management vertical interconnection 140M may be between the first semiconductor device 110 and the second semiconductor device 120. In this way, since a path for transferring memory management signals between the memory management vertical interconnection 140M and the first semiconductor device 110 may be reduced as much as possible, high-speed efficient transfer of memory management signals may be achieved.

In some embodiments, a dummy vertical interconnection DMY may be adjacent to the second semiconductor device 120. The dummy vertical interconnection DMY may be a vertical interconnection contributing only to coupling between the lower package 100B and the upper package 100T without substantially contributing to electrical operations. In some embodiments, the dummy vertical interconnection DMY may be adjacent to side surfaces not facing the first semiconductor device 110 among side surfaces of the second semiconductor device 120.

FIG. 2B illustrates that dummy vertical interconnections DMY are only in a partial region of the whole lower package 100B. In one embodiment, the dummy vertical interconnections DMY may be uniformly arranged throughout the whole lower package 100B.

In some embodiments, a ground vertical interconnection GND may be adjacent to the second semiconductor device 120. The ground vertical interconnection GND may provide a connection path to ground terminals for the upper package 100T and/or the lower package 100B. In some embodiments, the ground vertical interconnection GND may be adjacent to the side surfaces not facing the first semiconductor device 110 among the side surfaces of the second semiconductor device 120. For example, among the side surfaces of the second semiconductor device 120, the ground vertical interconnection GND may be adjacent to a side surface at an opposite side to a side surface facing the first semiconductor device 110.

In some embodiments, a power vertical interconnection PWR may be adjacent to the second semiconductor device 120. The power vertical interconnection PWR may provide a path for supplying power for the upper package 100T and/or the lower package 100B. In some embodiments, the power vertical interconnection PWR may be adjacent to the side surfaces not facing the first semiconductor device 110 among the side surfaces of the second semiconductor device 120. For example, among the side surfaces of the second semiconductor device 120, the power vertical interconnection PWR may be adjacent to the side surface at an opposite side to the side surface facing the first semiconductor device 110.

FIG. 2B illustrates that the ground vertical interconnection GND and the power vertical interconnection PWR are arranged only in a partial region out of the whole lower package 100B. In one embodiment, ground vertical interconnections GND and/or power vertical interconnections PWR may be arranged throughout the whole lower package 100B.

As illustrated in FIG. 2B, the plurality of vertical interconnections 140 may be located along an outer periphery of the lower package 100B, e.g., along edges of the lower package substrate 101. The plurality of vertical interconnections 140 may include the data input-output vertical interconnection 140D, the CA vertical interconnection 140C, the memory management vertical interconnection 140M, the dummy vertical interconnection DMY, the ground vertical interconnection GND, and the power vertical interconnection PWR, and may also include vertical interconnections performing other functions. In addition, the plurality of vertical interconnections 140 may be in a space between the first semiconductor device 110 and the second semiconductor device 120.

All of the vertical interconnections 140 of FIG. 2B may contribute to mechanical connection and coupling between the upper package 100T and the lower package 100B. As described above, since the plurality of vertical interconnections 140 are also located in the space between the first semiconductor device 110 and the second semiconductor device 120, the PoP semiconductor package 100 may have reduced warpage and also may exhibit improved mechanical properties of connection terminals.

Figure 3:
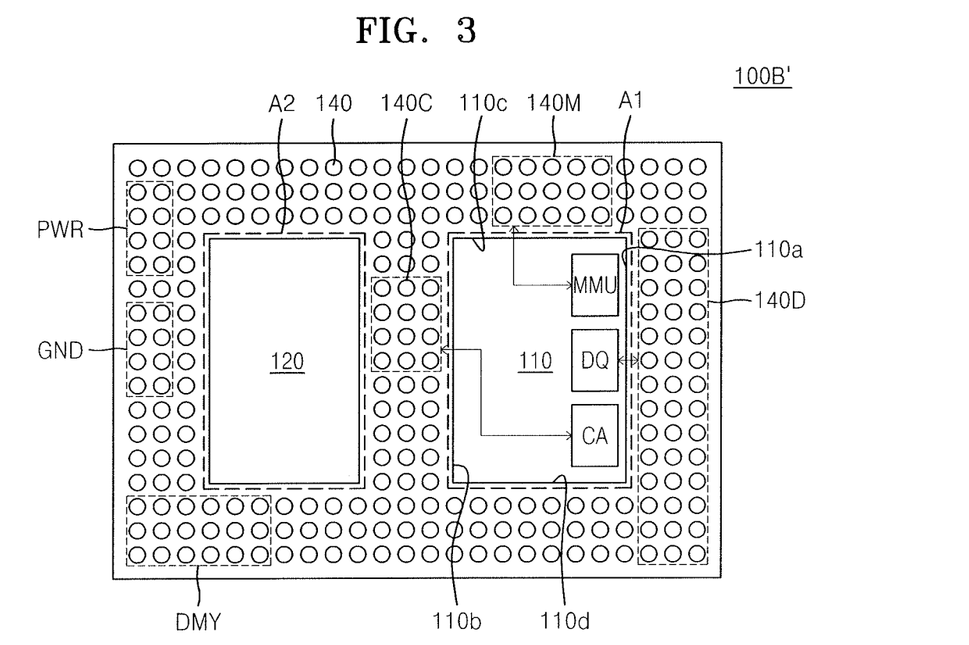
FIG. 3 illustrates another embodiment of a lower package.

FIG. 3 illustrates a plan view of an embodiment of a lower package 100B', which differs from the embodiment of FIG. 2B only in the arrangement of the CA vertical interconnection 140C and the memory management vertical interconnection 140M.

Referring to FIG. 3, the CA vertical interconnection 140C may be adjacent to the second side surface 110b. For example, the CA vertical interconnection 140C may be between the first semiconductor device 110 and the second semiconductor device 120. In this way, since the path for transferring CA signals between the CA vertical interconnection 140C and the first semiconductor device 110 may be reduced as much as possible, high-speed efficient transfer of CA signals may be achieved.

In addition, the memory management vertical interconnection 140M may be adjacent to the third side surface 110c. In this way, since the path for transferring memory management signals between the memory management vertical interconnection 140M and the first semiconductor device 110 may be reduced as much as possible, high-speed efficient transfer of memory management signals may be achieved.

FIG. 3 illustrates that the memory management vertical interconnection 140M is adjacent to the third side surface 110c. In one embodiment, the memory management vertical interconnection 140M may be adjacent to the fourth side surface 110d.

Figure 4A:
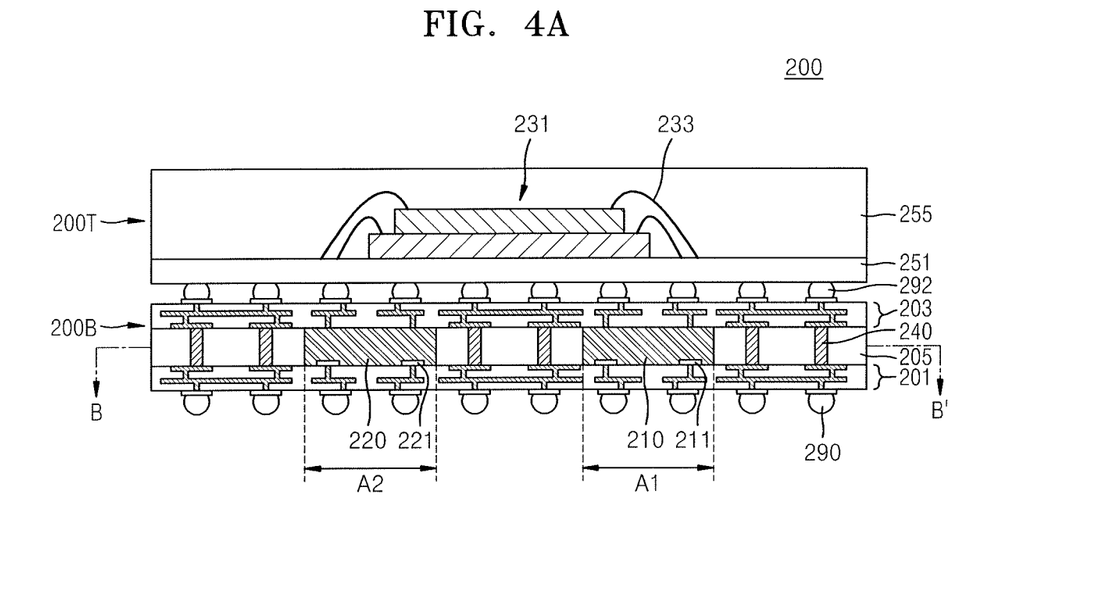
FIG. 4A illustrates a side cross-sectional view of a PoP semiconductor package according to another embodiment.
Figure 4B:
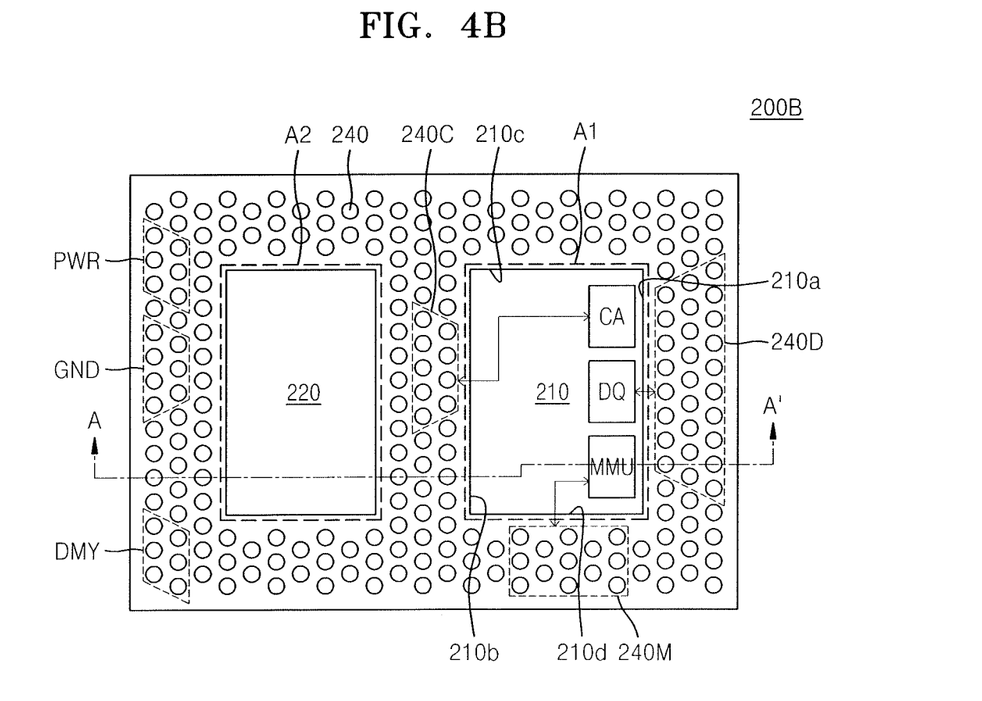
FIG. 4B illustrates a plan view of a central cross-section of a lower package of the PoP semiconductor package of FIG. 4A.

FIG. 4A illustrates a side cross-sectional view of a PoP semiconductor package 200 according to another embodiment. FIG. 4B illustrates a plan view of a central cross-section of a lower package 200B of the PoP semiconductor package 200 of FIG. 4A. In particular, FIG. 4A illustrates a cross-sectional view along line A-A' of FIG. 4B.

Referring to FIGS. 4A and 4B, the PoP semiconductor package 200 may include an upper package 200T and a lower package 200B. The upper package 200T may be substantially identical to the upper package 100T described with reference to FIG. 2A.

The lower package 200B may include a first semiconductor device 210 and a second semiconductor device 220, which are buried in a lower package substrate 205. FIG. 4A illustrates that a thickness of each of the first semiconductor device 210 and the second semiconductor device 220 is equal to a thickness of the lower package substrate 205. However, these thicknesses may be different in another embodiment. The first semiconductor device 210 and the second semiconductor device 220 may be respectively substantially identical to the first semiconductor device 110 and the second semiconductor device 120.

The lower package 200B may include an upper redistribution layer 203 and a lower redistribution layer 201, which are respectively adjacent to an upper surface and a lower surface thereof. The upper redistribution layer 203 and the lower redistribution layer 201 may electrically connect a connection terminal 211 of the first semiconductor device 210 and a connection terminal 221 of the second semiconductor device 220 to the upper package 200T or a device external to the PoP semiconductor package 200. FIG. 4A illustrates that each of the upper redistribution layer 203 and the lower redistribution layer 201 includes one layer. In one embodiment, each of the upper redistribution layer 203 and the lower redistribution layer 201 may include a plurality of layers.

In addition, since the redistribution described above allows an interval between connection terminals 290 for connection to terminals external to the PoP semiconductor package 200 to be greater than an interval between the connection terminal 211 of the first semiconductor device 210 and the connection terminal 221 of the second semiconductor device 220, stable connection to the external device may be achieved. A fan-out type redistribution described above may also identically acts on connection to the upper package 200T.

Each of the upper redistribution layer 203 and the lower redistribution layer 201 may be obtained by performing a deposition process, which includes forming a passivation layer which is an insulator and then forming a conductive wiring line by patterning or plating. In one embodiment, each of the upper redistribution layer 203 and the lower redistribution layer 201 may be fabricated in a bottom-up manner. Therefore, the upper redistribution layer 203 and the lower redistribution layer 201 may be different from the lower package substrate 101 of FIG. 2A, for example, a printed circuit board.

In the lower package substrate 205, via structures connecting terminals of the upper redistribution layer 203 to terminals of the lower redistribution layer 201 may be provided as vertical interconnections 240. FIG. 4A illustrates that the vertical interconnections 240 of the via structures have pillar shapes. In one embodiment, the vertical interconnections 240 may have tapered shapes, shapes in which multiple layers (including two or more layers) are combined with each other, or another shape.

FIG. 4B illustrates a layout of the vertical interconnections 240, and also illustrates a cross-section cut along line B-B' of FIG. 4A. FIG. 4B illustrates an example in which the vertical interconnections 240 have a regular arrangement of equilateral triangles. When the vertical interconnections 240 have a regular arrangement of equilateral triangles, the PoP semiconductor package 200 may have a reduced planar area because the PoP semiconductor package 200 may have a more compact configuration than when the vertical interconnections 240 have a regular arrangement of squares as in the case of FIG. 2B.

Similarly to the first semiconductor device 110, the first semiconductor device 210 may have a first side surface 210*a*, a second side surface 210*b*, a third side surface 210*c*, and a fourth side surface 210*d*. The second side surface 210*b* may be a side surface facing the second semiconductor device 220.

A data input-output vertical interconnection 240D may be adjacent to the first side surface 210*a* of the first semiconductor device 210. In this way, high-speed efficient transfer of data may be achieved since a data transfer path to a memory device 231 in the upper package 200I may be reduced as much as possible.

In addition, a CA vertical interconnection 240C may be adjacent to the second side surface 210*b*. For example, the CA vertical interconnection 240C may be between the first semiconductor device 210 and the second semiconductor device 220. In this way, high-speed efficient transfer of CA signals may be achieved since a path for transferring CA signals between the CA vertical interconnection 240C and the first semiconductor device 210 may be reduced as much as possible.

Further, a memory management vertical interconnection 240M may be adjacent to the fourth side surface 210*d*. In this way, high-speed efficient transfer of memory management signals may be achieved since a path for transferring memory management signals between the memory management vertical interconnection 240M and the first semiconductor device 210 may be reduced as much as possible.

FIG. 4B illustrates that the memory management vertical interconnection 240M is adjacent to the fourth side surface 210*d*. In one embodiment, the memory management vertical interconnection 240M may be adjacent to the third side surface 210*c*.

In some embodiments, the dummy vertical interconnection DMY may be adjacent to the second semiconductor device 220. The functions and effects of the dummy vertical interconnection DMY may be substantially identical to those of the dummy vertical interconnection DMY of FIG. 2B.

In some embodiments, the ground vertical interconnection GND may be adjacent to the second semiconductor device 220. In addition, the power vertical interconnection PWR may be adjacent to the second semiconductor device 220. The functions and effects of the ground vertical interconnection GND and the power vertical interconnection PWR are substantially identical to those of FIG. 2B.

Figure 5A:
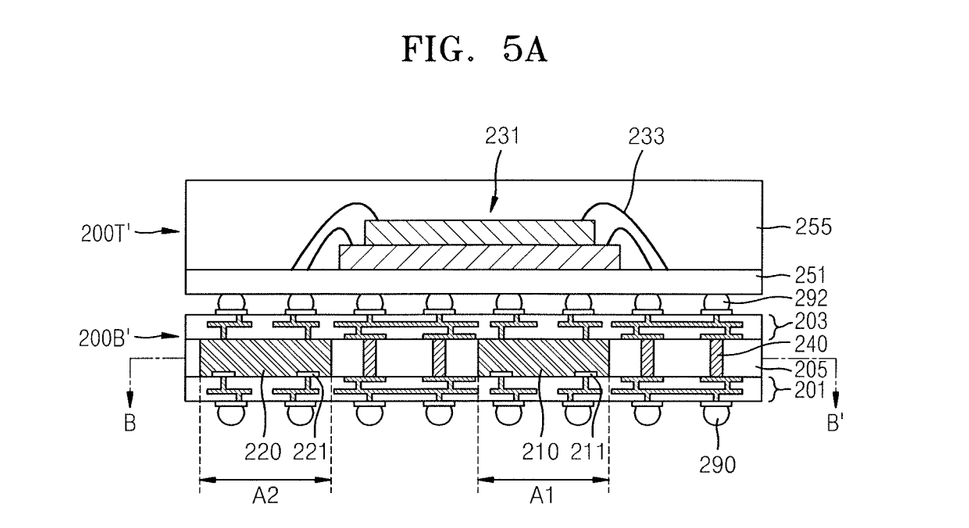
FIG. 5A illustrates a side cross-sectional view of a PoP semiconductor package according to another embodiment.
Figure 5B:
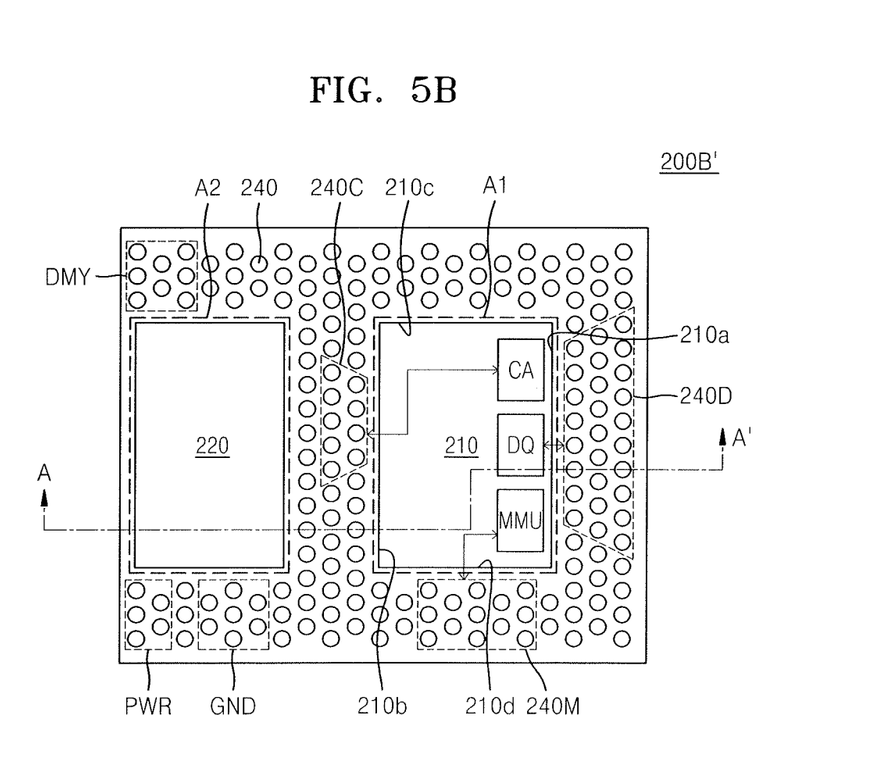
FIG. 5B illustrates a plan view of a central cross-section of a lower package of the PoP semiconductor package of FIG. 5A.

FIG. 5A illustrates a side cross-sectional view of a PoP semiconductor package 200' according to another embodiment. FIG. 5B illustrates a plan view of a central cross-section of a lower package 200B' of the PoP semiconductor package 200' of FIG. 5A, as viewed from above. In particular, the side cross-sectional view of FIG. 5A illustrates a cross-section cut along line A-A' of FIG. 5B.

The PoP semiconductor package 200' of FIGS. 5A and 5B is different from the embodiment of FIGS. 4A and 4B in that a portion of each of the upper package 200T and the lower package 200B at one side thereof in FIGS. 4A and 4B is omitted. For example, the PoP semiconductor package 200' of FIG. 5A may be different from the PoP semiconductor package 200 of FIG. 4A in that a portion of the PoP semiconductor package 200' at one side thereof (left side in FIG. 4A) is omitted.

The cross-section of the lower package 200B' of FIG. 5B may also be different from the cross-section of the lower package 200B of FIG. 4B in that a portion of the lower package 200B' at one side thereof (left side in FIG. 4B) is omitted. The PoP semiconductor package 200' may be identical to the PoP semiconductor package 200 in terms of points other than the different points described above.

Referring to FIGS. 5A and 5B, in the PoP semiconductor package 200', among side surfaces of the second semiconductor device 220, a portion facing a side surface in opposition to a side surface facing the first semiconductor device 210 (e.g., a portion facing a side surface farther away from the first semiconductor device 210 among side surfaces parallel to the second side surface 210*b*) is omitted. Since the PoP semiconductor package 200' has a greatly reduced planar area compared with the PoP semiconductor package 200 of FIG. 4A, the PoP semiconductor package 200' having more compact size and shape may be provided.

However, positions of the ground vertical interconnection GND and the power vertical interconnection GND located in the omitted portion may vary. Referring to FIG. 5B, each of the ground vertical interconnection GND and the power vertical interconnection GND may be adjacent to the second semiconductor device 220 and simultaneously not adjacent to the first semiconductor device 210. This may be for arranging data input-output vertical interconnections 240D, CA vertical interconnections 240C, and memory management vertical interconnections 240M in as larger numbers as possible at positions adjacent to the first semiconductor device 210.

Figure 6:
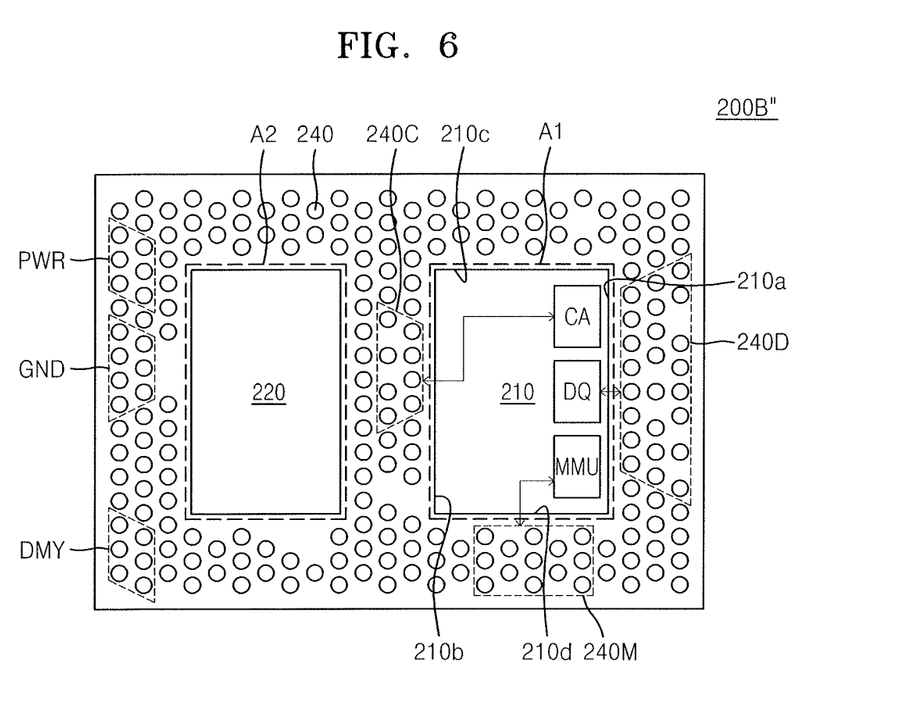
FIG. 6 illustrates a plan view of a central cross-section of a lower package of a PoP semiconductor package according to another embodiment.

FIG. 6 illustrates a plan view of a central cross-section of a lower package 200B" of a PoP semiconductor package according to another embodiment. The lower package 200B" of FIG. 6 is different from the lower package 200B of FIG. 4B in that arrangement intervals of the vertical interconnections 240 in the lower package 200B" are not regular. Since the lower package 200B" is identical to the lower package 200B in terms of points other than the different points described above, the different points will be mainly described.

Since unneeded vertical interconnections 240 may be omitted from the lower package 200B" of FIG. 6, a more compact layout may be allowed to be designed. In addition, a layout optimized by taking into account lengths of transfer paths of signals may be designed.

Even though the arrangement intervals of the vertical interconnections 240 are not regular, arrangement intervals of connection terminals 292 to the upper package 200T and the connection terminals 290 to a device external to the PoP semiconductor package may be regular (e.g., see FIG. 4A). The reason for this is that the arrangement intervals of the connection terminals 290 and 292 may be adjusted by the upper redistribution layer 203 and the lower redistribution layer 201. Therefore, the upper package 200T may be connected to the lower package 200B, 200B', or 200B" via connection terminals, for example, solder bumps, which have regular arrangement intervals.

Figure 7A:
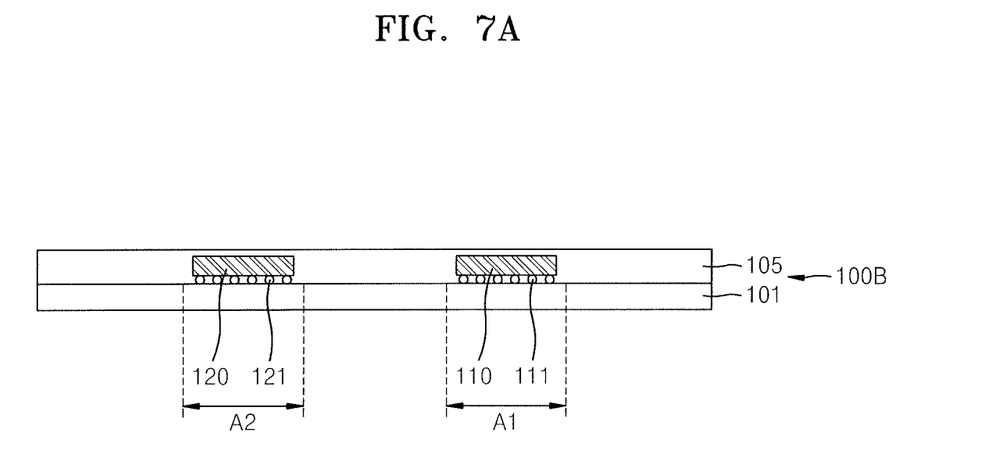
FIGS. 7A to 7C illustrate various stages of an embodiment of a method for fabricating a PoP semiconductor package.
Figure 7B:
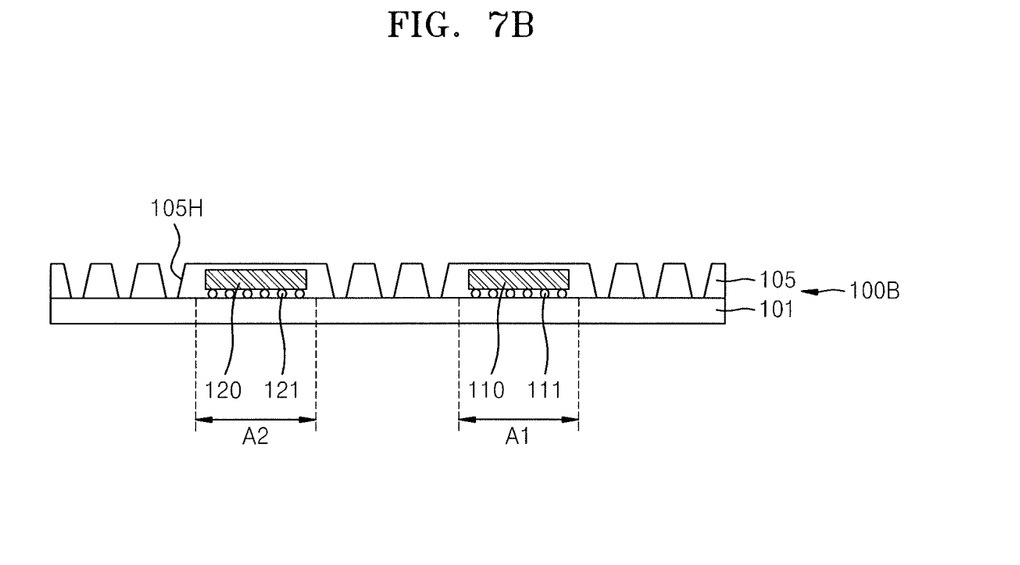
Figure 7C:
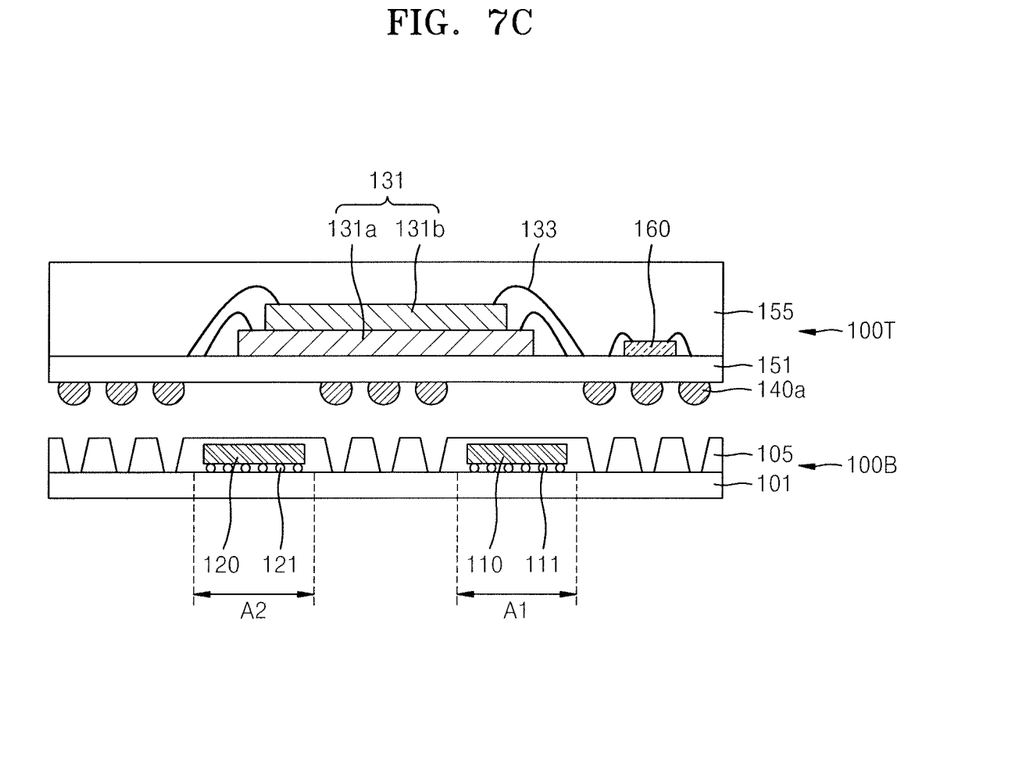

FIGS. 7A to 7C illustrate side cross-sectional views of various stages of a method for fabricating the PoP semiconductor package 100 according to an embodiment.

Referring to FIG. 7A, the method includes providing the lower package 100B. The lower package 100B may include the lower package substrate 101. The first semiconductor device 110 and the second semiconductor device 120 are mounted on the lower package substrate 101 and arranged in a lateral direction. The first semiconductor device 110 and the second semiconductor device 120 may be respectively arranged in the first area A1 and the second area A2, and may be encapsulated by the encapsulation material 105. Each of the first semiconductor device 110 and the second semiconductor device 120 may be one semiconductor chip or one package.

FIG. 7A illustrates that the encapsulation material 105 covers upper surfaces of the first semiconductor device 110 and the second semiconductor device 120. In one embodiment, an upper surface of the encapsulation material 105 may be on the same plane as the upper surfaces of the first semiconductor device 110 and/or the second semiconductor device 120. The first semiconductor device 110 and the second semiconductor device 120 have been described with reference to FIGS. 2A and 2B.

Referring to FIG. 7B, a through-hole 105H is formed at a position at which a vertical interconnection is intended to be formed. The through-hole 105H is formed to penetrate the encapsulation material 105 and, for example, may be formed by drilling or another method.

FIG. 7B illustrates that the through-hole 105h is formed to expose an upper surface of the lower package substrate 101. In some other embodiments, a conductive bump may be formed on the upper surface of the lower package substrate 101 at a position at which the through-hole 105H is to be formed. The encapsulation material 105 may be coated on the conductive bump to cover the conductive bump. In this case, when the through-hole 105H is formed, only a portion of an upper surface of the conductive bump may be exposed and the upper surface of the lower package substrate 101 may not be exposed.

Referring to FIG. 7C, the upper package 100T may be provided on the lower package 100B. The upper package 100T may be an upper package in which the memory device 131 is mounted on the upper package substrate 151. The upper package 100T may include the first memory chip 131a and the second memory chip 131b, which are vertically stacked. The memory device 131 may be electrically connected to the upper package substrate 151 via the bonding wire 133. The memory device 131 has been described with reference to FIG. 2A.

Conductive terminals 140a may be provided to a lower surface of the upper package substrate 151 to match through-holes 105H. When the upper package 100T is provided on the lower package 100B and then heat and pressure are applied thereto, the conductive terminals 140a reflow and are coupled to the lower package 100B in the through-holes 105H, thereby forming the PoP semiconductor package 100 as in FIG. 2A.

FIGS. 8A to 8D illustrate side cross-sectional views of various stages of a method for fabricating the PoP semiconductor package 200 according to another embodiment.

Figure 8A:
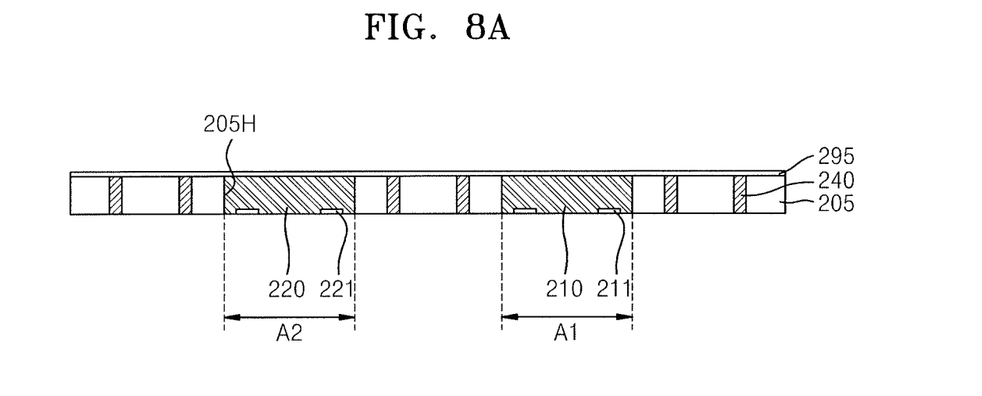
FIGS. 8A to 8D illustrate various stages of another embodiment of a method for fabricating a PoP semiconductor package.

Referring to FIG. 8A, the method includes providing the lower package substrate 205 including cavities 205H respectively in the first area A1 and the second area A2. The first semiconductor device 210 and the second semiconductor device 220 may be respectively received in the cavities 205H. For example, the first semiconductor device 210 and the second semiconductor device 220 may be respectively arranged in the cavities 205H. A securing member 295 (e.g., an adhesive tape or other fastener) for securing the first semiconductor device 210 and the second semiconductor device 220 may be provided to one surface of the lower package substrate 205.

The vertical interconnections 240 may be formed before the first semiconductor device 210 and the second semiconductor device 220 are arranged, or after the first semiconductor device 210 and the second semiconductor device 220 are arranged.

Figure 8B:
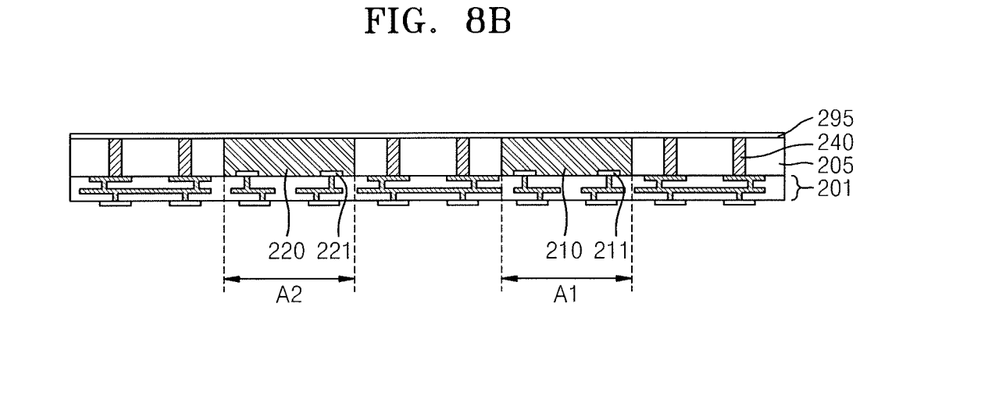

Referring to FIG. 8B, the lower redistribution layer 201 is formed on an exposed surface of the lower package substrate 205 and exposed surfaces of the first semiconductor device 210 and the second semiconductor device 220. The lower redistribution layer 201 may be formed first in this example, the upper redistribution layer 203 described below may be formed first in another embodiment.

To form the lower redistribution layer 201, an insulating layer may be formed. The insulating layer may be patterned to function as a mold.

Next, for example, a seed metal layer is formed, and then a conductive wiring line may be formed by electrolytic plating, electroless plating, immersion plating, or another plating method. This process may be performed once or a plurality of times.

Figure 8C:
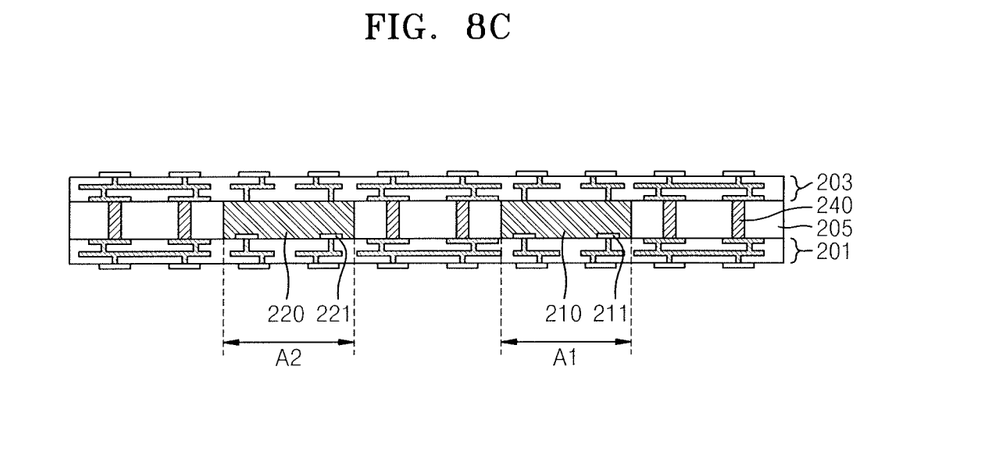

Referring to FIG. 8C, the securing member 295 is removed, and then, the upper redistribution layer 203 may also be formed, in the same manner as in FIG. 8, on an opposite surface of the lower package substrate 205 with respect to the surface thereof on which the lower redistribution layer 201 is formed. Since the method of forming a redistribution layer has been described with reference to FIG. 8B, repeated descriptions thereof will be omitted.

Figure 8D:
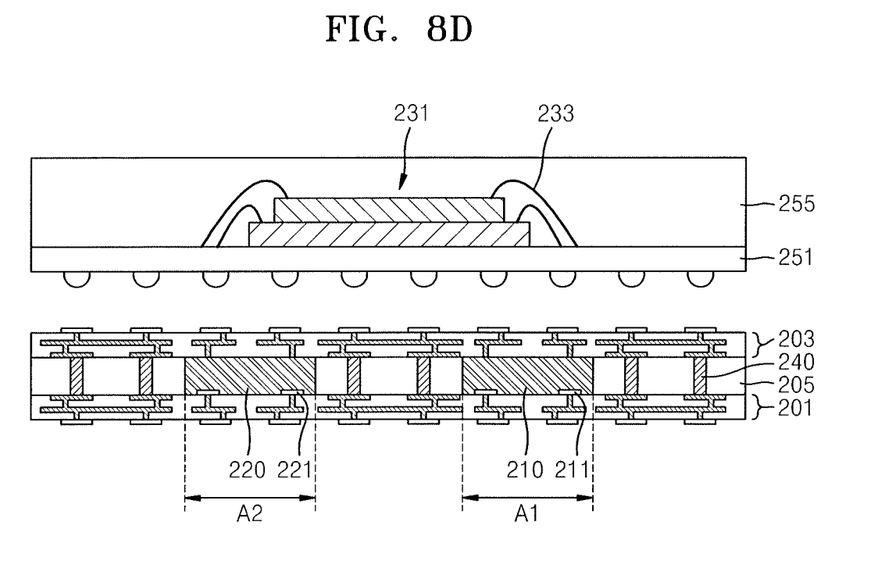

Referring to FIG. 8D, the upper package 200T is provided onto the lower package 200B. In the upper package 200T, the memory device 231 is mounted on an upper package substrate 251 via a bonding wire 233. The upper package 2001 may be substantially identical to the upper package 100T of FIG. 7C. Next, the upper package 2001 and the lower package 200B are pressed to each other while heated, thereby obtaining the PoP semiconductor package 200 of FIG. 4A. The PoP semiconductor package may therefore be formed to have improved mechanical and electrical properties.

Figure 9:
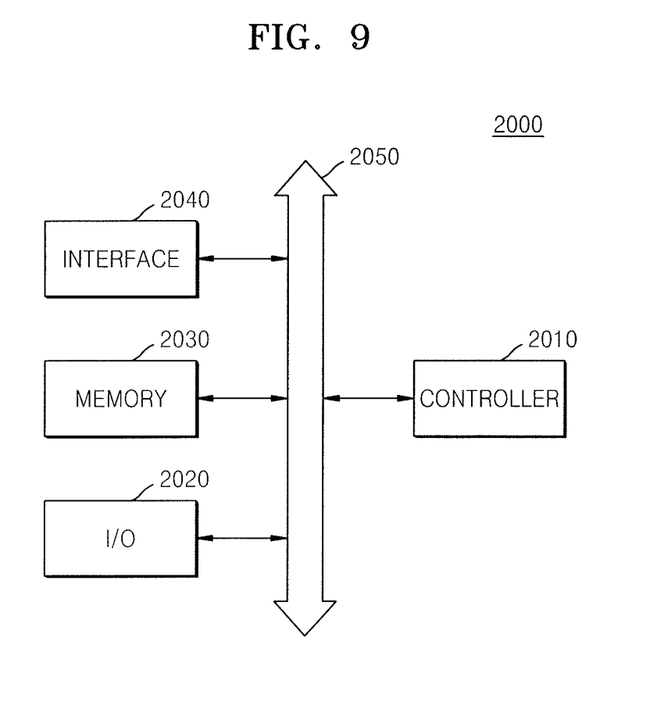
FIG. 9 illustrates an embodiment of an electronic system.

FIG. 9 illustrates an embodiment of an electronic system 2000 which includes a controller 2010, an input-output (I/O) device 2020, memory 2030, and an interface 2040, and these components are connected to each other via a bus 2050.

The controller 2010 may include at least one of a microprocessor, a digital signal processor, and a processor similar thereto. The input-output device 2020 may include at least one of a keypad, a keyboard, and a display. The memory 2030 may be used to store commands executed by the controller 2010. For example, the memory 2030 may be used to store user data.

The electronic system 2000 may be a wireless communication device or a device for transmitting and/or receiving information in a wireless environment. In one embodiment, in order to transmit/receive data via a wireless communication network, the interface 2040 may be a wireless interface. The interface 2040 may include an antenna and/or a wireless transceiver. In some embodiments, the electronic system 2000 may be used for a communication interface protocol of a third-generation communication system, e.g., code division multiple access (CDMA), global system for mobile communications (GSM), North American digital cellular (NADC), extended-time division multiple access (E-TDMA), and/or wide band code division multiple access (WCDMA). In the electronic system 2000, in particular, at least one of the controller 2010 and the memory 2030 includes at least one of the PoP semiconductor packages in accordance with one or more of the embodiments described herein.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, power management features, interfaces, and other signal providing, signal generating, and signal processing features of the embodiments described herein may be implemented in non-transitory logic which, for example, may include hardware, software, or both. When implemented at least partially in hardware, the controllers, power management features, interfaces, and other signal providing, signal generating, and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, power management features, interfaces, and other signal providing, signal generating, and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A package-on-package (PoP) semiconductor package, comprising:
   an upper package; and
   a lower package including:
   a first semiconductor device in a first area;
   a second semiconductor device in a second area; and
   a command-and-address (CA) vertical interconnection, a data input-output vertical interconnection, and a memory management vertical interconnection adjacent to the first area, wherein:
   the first semiconductor device includes a controller of the PoP semiconductor package, and
   the second semiconductor device includes a power management integrated circuit of the PoP semiconductor package.

2. The PoP semiconductor package as claimed in claim 1, wherein at least one of the CA vertical interconnection, the data input-output vertical interconnection, and the memory management vertical interconnection is between the first area and the second area.

3. The PoP semiconductor package as claimed in claim 1, wherein a dummy vertical interconnection is adjacent to the second semiconductor device.

4. The PoP semiconductor package as claimed in claim 1, wherein:
   the upper package includes a non-volatile memory device, and
   the non-volatile memory device is to transmit CA signals to and receive CA signals from the first semiconductor device via the CA vertical interconnection.

5. The PoP semiconductor package as claimed in claim 4, wherein the non-volatile memory device is to transmit memory management signals to and receive memory management signals from the first semiconductor device via the memory management vertical interconnection.

6. The PoP semiconductor package as claimed in claim 1, wherein the lower package includes a lower package substrate which includes the first area and the second area.

7. The PoP semiconductor package as claimed in claim 6, wherein the upper package is connected to the lower package by a plurality of vertical interconnections arranged along edges of the lower package substrate.

8. The PoP semiconductor package as claimed in claim 7, wherein the plurality of vertical interconnections are solder bumps.

9. The PoP semiconductor package as claimed in claim 1, wherein the lower package includes an upper redistribution layer and a lower redistribution layer which are respectively adjacent to an upper surface and a lower surface thereof.

10. The PoP semiconductor package as claimed in claim 9, wherein the CA vertical interconnection, the data input-output vertical interconnection, and the memory management vertical interconnection are via structures electrically connecting the upper redistribution layer to the lower redistribution layer.

11. The PoP semiconductor package as claimed in claim 10, wherein arrangement intervals of the via structures are irregular.

12. An electronic system, comprising:
    a controller;
    an input-output to input or output data;
    a memory to store data;
    an interface to transfer data between the electronic system and a device external to the electronic system; and
    a bus to connect the controller, the input-output, the memory, and the interface to each other to allow communication therebetween, wherein at least one of the controller and the memory includes a package-on-package (PoP) semiconductor package as claimed in claim 1.

13. A PoP semiconductor package, comprising:
    an upper package; and
    a lower package including:
    a first semiconductor device in a first area;
    a second semiconductor device in a second area; and a command-and-address (CA) vertical interconnection, a data input-output vertical interconnection, and a memory management vertical interconnection adjacent to the first area,
wherein a ground vertical interconnection or a power vertical interconnection is adjacent to a first side surface of the second semiconductor device opposite to a second side surface of the second semiconductor device, the second side surface of the second semiconductor device facing the first semiconductor device.

14. A stack semiconductor package, comprising
an upper package; and
a lower package including:
an application processor (AP) chip;
a power management integrated circuit chip; and
a command-and-address (CA) vertical interconnection and a data input-output vertical interconnection adjacent to the AP chip in side directions of the AP chip, wherein the AP chip and the power management integrated circuit chip are arranged in a lateral direction.

15. The stack semiconductor package as claimed in claim 14, wherein:
the AP chip includes a first side surface parallel to a second side surface,
the data input-output vertical interconnection is adjacent to the first side surface, and
the CA vertical interconnection is adjacent to the second side surface.

16. The stack semiconductor package as claimed in claim 15, wherein:
the AP chip includes a third side surface parallel to a fourth side surface, and
the stack semiconductor package includes a memory management vertical interconnection adjacent to at least one of the third side surface and the fourth side surface.

17. The stack semiconductor package as claimed in claim 15, wherein the second side surface faces the power management integrated circuit chip.

18. The stack semiconductor package as claimed in claim 14, wherein:
the AP chip includes a first side surface and a third side surface,
the first side surface extends in a direction crossing a direction in which the third side surface extends,
the data input-output vertical interconnection is adjacent to the first side surface, and
the CA vertical interconnection is adjacent to the third side surface.

19. A package-on-package (PoP) semiconductor package, comprising:
an upper package; and
a lower package including:
an application processor (AP) chip in a first area;
a power management integrated circuit chip in a second area; and
at least one of a command-and-address (CA) vertical interconnection and a memory management vertical interconnection between the AP chip and the power management integrated circuit chip.

* * * * *